United States Patent [19]
Lechevin et al.

[11] 4,105,981
[45] Aug. 8, 1978

[54] SYNCHRONOUS DEMODULATION DEVICE

[75] Inventors: René Lechevin; Henri Butin, both of Paris, France

[73] Assignee: Thomson-CSF, Paris, France

[21] Appl. No.: 842,324

[22] Filed: Oct. 14, 1977

[30] Foreign Application Priority Data

Oct. 19, 1976 [FR] France .................. 76 31354

[51] Int. Cl.² ............................................. H03D 3/18
[52] U.S. Cl. ...................................... 329/50; 329/112
[58] Field of Search .............. 329/50, 112, 109, 146; 331/12

[56] References Cited
U.S. PATENT DOCUMENTS

| | | | |
|---|---|---|---|
| 3,403,355 | 9/1968 | Takada | 331/12 |
| 3,588,734 | 6/1971 | Welti | 331/12 |
| 3,748,590 | 7/1973 | Gray | 331/12 |
| 3,768,030 | 10/1973 | Brown | 331/12 |
| 3,990,016 | 11/1976 | Dimon | 331/12 |

*Primary Examiner*—John Kominski
*Attorney, Agent, or Firm*—Cushman, Darby & Cushman

[57] ABSTRACT

A demodulation signal results from the sum or difference of two output signals, respectively from two demodulators applied in parallel with the signal for demodulation and in quadrature by a local carrier generator having the same frequency that the one of the received modulated signal.

3 Claims, 3 Drawing Figures

SYNCHRONOUS DEMODULATION DEVICE

The present invention relates to synchronous demodulators for demodulating double-sideband amplitude-modulated signals, in particular demodulators of the kind used in the telephone sets of frequency-division multiplex switching systems which make it possible to establish calls between more than two subscribers.

Those skilled in the art will be aware that prior art synchronous demodulators not only require strict synchronisation between the carrier frequency of the double-sideband amplitude-modulated signal and the frequency generated at the receiving end in order to perform demodulation, but also require that these signals to be rendered co-phasal under certain conditions outside which the amplitude of the received modulating signal waries radically and may even disappear altogether.

It is well-known to achieve a correct phase relationship using a control system based upon the direct component demodulated along with the modulating signal when a certain level of a component having the frequency of the carrier is added to the two modulation bands of the modulated signal which is to be received. The amplitude of this direct component is a function of the phase difference between the carrier of the received signal and the carrier generated at the receiving end. It is convenient to control the phase of the latter in order to suppress this component, this resulting in a peak modulating signal level at the output of the demodulator if the carrier frequency component reinjected at the time of transmission is in phase-quadrature with the suppressed primary carrier of the modulated signal. In the situation where it is in phase, it is known to use two synchronous demodulators one of which receives a local carrier signal which is in quadrature with that received by the other, one of these demodulators being used to extract the demodulating signal and the other to extract the direct component which is to be suppressed.

However, these approaches all require a control device which essentially comprises a variable phase-shift element and a narrow-band filter, this leading to a substantial pull-in delay so that the system does not allow a rapid handling of successive subscribers utilising separate telephone sets, the kind of situation occurring in some telephone operating configurations such as for example "a conference call". Moreover, arrangements of this kind are expensive, interfere with the reliability of the system and require the presence in the transmitted signals of a given level on the part of a component at the carrier frequency.

The object of the present invention is to remedy all these drawbacks.

According to the invention, there is provided a synchronous demodulation device for demodulating a double sideband amplitude-modulated signal and comprising: two synchronous demodulators having respective signal inputs for receiving in parallel said signal, auxiliary inputs, and outputs; a local generator having an output for supplying in phase quadrature said auxiliary inputs with a signal whose frequency is equal to that of the carrier of said signal; means for adding and subtracting the output signals from said two demodulators, means for determining the sign of the product of said output signals and means for controlling, as a function of said sign, said adding and subtracting means whose output constitutes the output of said device.

The invention will be better understood and other of its features rendered apparent from a consideration of the ensuing description and the related drawings in which.

Figure 1:
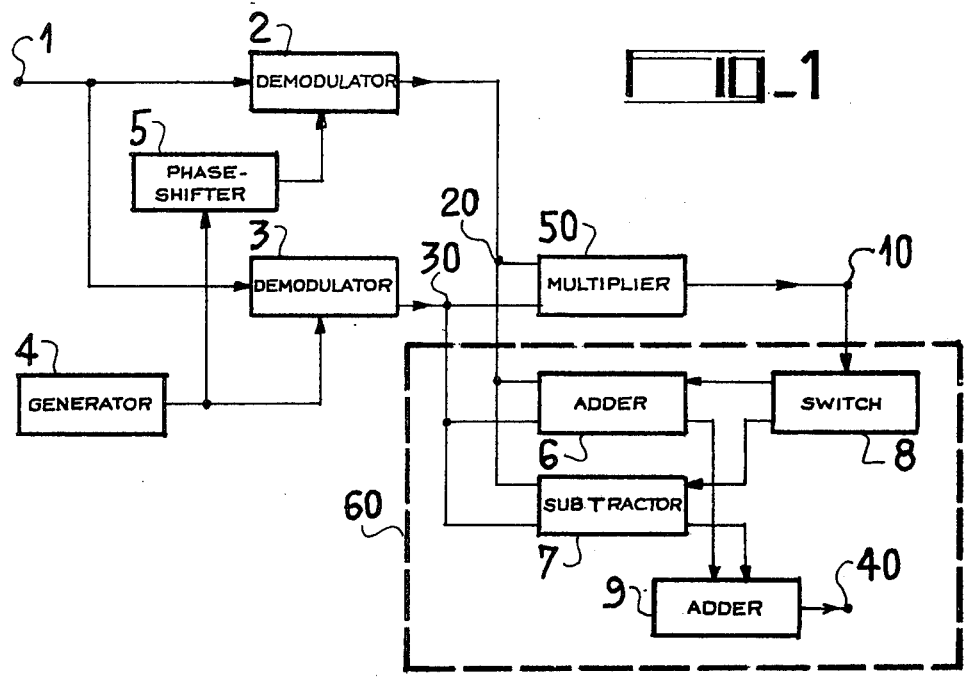
FIG. 1 is a diagram of a synchronous demodulation device in accordance with the invention.

In FIG. 1, two identical synchronous demodulators 2 and 3, whose output signals are produced at the respective terminals 20 and 30, are supplied at first inputs with an amplitude-modulated signal applied to an input terminal 1, and at second inputs with the output signals furnished by a generator 4 directly supplying the demodulator 3 and supplying the demodulator 2 through the intermediary of a 90° phase-shifter.

The output terminals 20 and 30 are connected in parallel to the two respective signal inputs of a multiplier 50 and to those of a processor circuit 60 whose third input is supplied with the signal appearing at the output 10 of the multiplier 50.

The circuit 60 comprises an adder 6 and a subtractor 7 two of whose inputs are connected respectively to the terminals 20 and 30 whilst their third inputs are respectively connected to the two outputs of a switch 8 having an input connected to the terminal 10.

It also comprises an adder 9 receiving the signals supplied by the adder 6 and the subtractor 7, and whose output terminal 40 is that of the demodulation device.

Let $$A\sin\omega t \sin\Omega t$$

be a signal of amplitude $A$, and radian carrier frequency $\omega$, this signal being of suppressed-carrier double-sideband kind amplitude-modulated by a low frequency signal of radian frequency $\Omega$.

The generator 4 supplies to the demodulator 3 a signal $$B\sin(\omega t + \phi)$$

where $B$ is its amplitude and $\phi$ its phase and to the demodulator 2, because of the presence of the phase-shifter 5, a signal $$b\sin(\omega t - \pi/2 + \phi)$$

The demodulator 3 incorporates a low-pass filter and therefore furnishes the low frequency signal $$AB/2 \sin\Omega t \cos\phi$$

Similarly, the demodulator 2 furnishes the signal $$AB/2 \sin\Omega t \sin\phi$$

If we put $AB/2 \sin\Omega t = K$, then the signal produced by the adder 6 can be written as:

(1) $\quad K(\cos\phi + \sin\phi) = K\sqrt{2}\cos(\pi/4 - \phi)$ and that delivered by the subtractor 7 as (2) $\quad K(\cos\phi - \sin\phi) = K\sqrt{2}\sin(\pi/4 - \phi)$ It will be observed that the absolute value of equation (1) varies by only three decibels (from $K$ to $\sqrt{2}K$) for intervals on the part of the value $\phi$ ranging between 0 and $\pi/2$ or between $\pi$ and $3\pi/2$, these being values for which the product of the two signals, $K^2\sin\phi\cos\phi$, is positive, or 0 at the limit of the intervals.

By contrast, equation (2) varies by only three decibels for values of $\phi$ ranging between $\pi/2$ and $\pi$ or between $3\pi/2$ and $2\pi$, these being values for which the product $K^2\sin\phi\cos\phi$ is negative or 0 at the limit of the intervals.

The multiplier 50 supplies at its output 10 a logic "1" when the product of the signals is negative and a logic "0" when it is positive.

This logic signal is employed by the control device 8 which blocks the subtractor 7 and unblocks the adder 6 when it receives a "0" and performs the reverse operations when it receives a "1".

The indeterminacy which then occurs in the value of the signal furnished by the multiplier 50 when the product of the signals is zero (that is to say for $\phi = 0$, $\pi/2 + \pi$, $3\pi/2$), is of no importance since the absolute values of the sum and difference of the signal have the same value, equal to K.

Thus, whatever the value of $\phi$ the adder 9 will furnish the modulating signal with variations at the most equal to three decibels, this without the need for recourse to a feedback loop and by a simple electronic switching operation which can operate extremely quickly.

This device then allows correct telephone operation between more than two speakers, for example in the situation of break-in by an operator or where a "conference call" is being established. The switching, controlled by the strongest received signal, may vary frequently in position during the call, but because it is so fast, it produces no appreciable disturbance.

The telephone station therefore gives preference to the calling party producing the highest level without however eliminating the other calling parties who continue to be heard at varying levels.

The following Figure illustrates an example of the multiplier 50.

Figure 2:
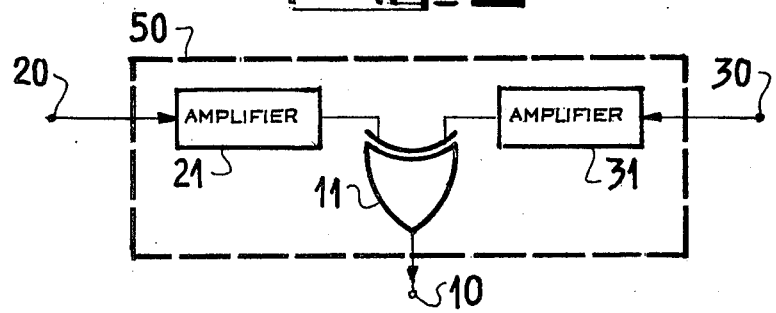
FIGS. 2 and 3 are preferred embodiments of certain elements of the diagram shown in FIG. 1.

In FIG. 2, the inputs 20 and 30 of the multiplier 50 respectively supply the amplifier-limiters 21 and 31 whose outputs are connected to the two corresponding inputs of an exclusive-OR gate 11 whose output 10 is that of the multiplier 50 itself.

The amplifiers 21 and 31 furnish a squarewave output signal characteristic of the instantaneous sign of the input signal applied to them.

The basic principle of an exclusive OR gate is such that the gate 11 produces at its output 10 a logic "1" signal when its inputs are supplied with signals of opposite sign, that is to say when the product is negative and, conversely, produces a logic "0" when its inputs are supplied with signals of the same sign, the product then being positive.

An example of a simple embodiment of the circuit 60 is described hereinafter.

Figure 3:
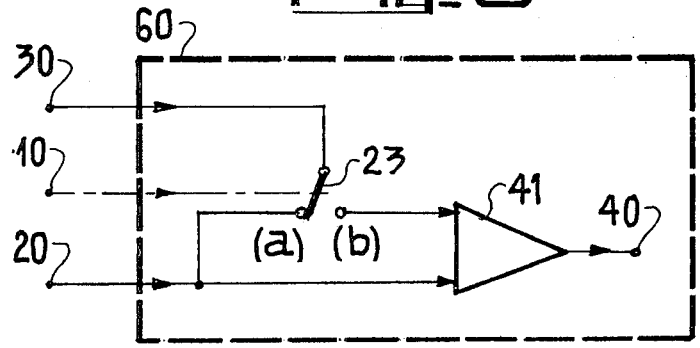

In FIG. 3, a differential amplifier 41 whose output is connected to the output terminal 40, is supplied at one of its two inputs with the signal applied to the first input 20 of the circuit 60, and at the other with that applied to the second input 30 via the position (b) of a switch 23 controlled by the signal received at the third input 10 of the circuit 60.

The switch 23, illustrated in the form of a mechanical switch, is in reality an electronic switch of one or other of the known kinds. In position (a) it connects the terminal 30 to the terminal 20.

If the product of the received signals is negative, the logic "1" signal appearing at the terminal 10 places the switch 23 in the position (1) and the applifier 41 produces the difference between the received signals.

If the contrary is the case, the received signals, via a matching circuit which has not been shown, supply the same input of the amplifier 41 which then produces their sum.

What we claim, is:

1. A synchronous demodulation device for demodulating a double sideband amplitude-modulated signal and comprising: two synchronous demodulators having respective signal inputs for receiving in parallel said signal, auxiliary inputs, and outputs; a local generator having an output for supplying in phase quadrature said auxiliary inputs with a signal whose frequency is equal to that of the carrier of said signal; means for adding and subtracting the output signals from said two demodulators, means for determining the sign of the product of said output signals and means for controlling, as a function of said sign, said adding and subtracting means whose output constitutes the output of said device.

2. A device as claimed in claim 1, wherein said means for determining said sign comprise two amplifier-limiters having inputs, respectively supplied with said output signals, and outputs; and an exclusive OR-gate having two inputs respectively connected to said amplifier-limiters outputs, and an output for delivering a two-stage digital control signal applied to said control means.

3. A device as claimed as claim 2, wherein said means for adding and subtracting comprises a differential amplifier having first a second inputs, and an output, and wherein said control means are an electronic switch controlled by said control signal, the output of one of said demodulator being connected to said first input, the output of the other demodulator being connected, through said switch, to said second input, when said electronic switch is in a first position, and coupled to said first input when said switch is in a second position.

* * * * *